US006828254B2

United States Patent
Han et al.

(10) Patent No.: US 6,828,254 B2
(45) Date of Patent: Dec. 7, 2004

(54) PLASMA ENHANCED CHEMICAL VAPOR DEPOSITION APPARATUS AND METHOD FOR FORMING NITRIDE LAYER USING THE SAME

(75) Inventors: Jae-Jong Han, Seoul (KR); Kyoung-Seok Kim, Seoul (KR); Byung-Ho Ahn, Gyeonggi-do (KR); Seung Mok Shin, Suwon (KR); Hwa-Sik Kim, Gyeonggi-do (KR); Hong-Bae Park, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 63 days.

(21) Appl. No.: 10/277,801

(22) Filed: Oct. 23, 2002

(65) Prior Publication Data
US 2003/0091753 A1 May 15, 2003

(30) Foreign Application Priority Data
Oct. 25, 2001 (KR) ........................................ 2001-66104

(51) Int. Cl.⁷ .............................................. H01L 21/31
(52) U.S. Cl. ...................... 438/758; 438/760; 438/761
(58) Field of Search ................................ 438/758, 624, 438/778, 788

(56) References Cited
U.S. PATENT DOCUMENTS

| | | | | |
|---|---|---|---|---|
| 5,846,332 A | * | 12/1998 | Zhao et al. | 118/728 |
| 5,964,947 A | * | 10/1999 | Zhao et al. | 118/715 |
| 6,063,441 A | * | 5/2000 | Koai et al. | 427/248.1 |
| 6,200,911 B1 | * | 3/2001 | Narwankar et al. | 438/758 |
| 6,270,859 B2 | * | 8/2001 | Zhao et al. | 427/535 |
| 6,281,146 B1 | | 8/2001 | Wang et al. | |
| 6,579,811 B2 | * | 6/2003 | Narwankar et al. | 438/758 |

* cited by examiner

Primary Examiner—John F. Niebling
Assistant Examiner—Olivia T. Luk
(74) Attorney, Agent, or Firm—Lee & Sterba, P.C.

(57) ABSTRACT

A plasma enhanced chemical vapor deposition apparatus and a method of forming a nitride layer using the same, wherein the plasma enhanced CVD apparatus includes a process chamber including an upper chamber with a dome shape, a lower chamber, and an insulator therebetween, a gas distributing ring, a susceptor for supporting a wafer and heating the process chamber, a plasma compensation ring surrounding the susceptor, a vacuum pump and an electric power source connected to the process chamber. The gas distributing ring has a plurality of upwardly inclined nozzles, allowing upward distribution of reactive gases. The method of forming a nitride layer includes forming a protective film on inner walls of a process chamber, the protective film having at least two layers of differeing dielectric constant, and sequentially supplying reactive gases to the process chamber. A nitride layer formed thereby has low hydrogen content, good density and oxidation resistance.

7 Claims, 8 Drawing Sheets

PLASMA ENHANCED CHEMICAL VAPOR DEPOSITION APPARATUS AND METHOD FOR FORMING NITRIDE LAYER USING THE SAME

BACKGROUND OF THE INVENTION

1. Field of the Invention

The present invention relates to a chemical vapor deposition (CVD) apparatus and a method for forming a nitride layer using the same. More particularly, the present invention relates to a plasma enhanced chemical vapor deposition (PECVD) apparatus used for fabricating a semiconductor device and a method of forming a nitride layer using the same.

2. Description of the Related Art

There is a wide range of uses for a nitride layer in the field of semiconductor devices. One use of a nitride layer is as an etching mask in an etching process for forming metal patterns from an aluminum layer or a titanium layer, and as a protection layer for preventing a semiconductor device from being contaminated. Another use of a nitride layer is as an insulator when formed between conductive layers. Still another use of a nitride layer is as an etch-stopping layer to detect an end point in an etching process.

Typically, a nitride layer is formed by a method of PECVD, as disclosed in the prior art. The prior art discloses that a thin film is deposited by introducing a process gas and a carrier gas into a process chamber sustaining a temperature of about 350–450° C. and a pressure of about 1–10 Torr. Then, a high frequency voltage of about 50–200 W at a source radio frequency of 13.56 MHz is applied to the process chamber to create a plasma atmosphere therein.

The method disclosed in the prior art has an advantage that device operation characteristics are not deteriorated because the process is performed at low temperature of about 350–450° C. However, the method also has many disadvantages, such as high degree of hydrogen content, low film density, weak oxidation resistance and film lifting, which are caused by high thermal stress after the thin film undergoes subsequent heat treatment processes.

FIG. 1 shows a conventional plasma enhanced CVD apparatus. The conventional plasma enhanced CVD apparatus includes a cylinder-type process chamber that comprises an upper chamber 10, a lower chamber 12 and an insulator 14 inserted between the upper chamber 10 and the lower chamber 12.

The method disclosed in the prior art has an advantage that device operation characteristics are not deteriorated because the process is performed at a low temperature of about 350–450° C. However, the method also has many disadvantages, such as high degree of hydrogen content, low film density, weak oxidation resistance and film lifting, which are caused by high thermal stress after the thin film undergoes subsequent heat treatment process.

An external end of a gas supply pipe 18 located outside the process chamber connected to a process gas supply source 20, also located outside the process chamber, is externally inserted into the process chamber through a top portion of the upper chamber 10. The other end, an internal end, of the gas supply pipe 18 located inside the process chamber is connected to a gas distributing plate 16.

FIG. 2 depicts a perspective view of a gas distributor in accordance with the conventional PECVD apparatus.

As shown in FIG. 2, the gas distributing plate 16 is a circular disk and has a plurality of gas distributing nozzles 17 at a bottom surface thereof, for facilitating downward ejection of process gases from the nozzles 17 toward a bottom of the lower chamber 12.

As shown in FIG. 1, the conventional plasma enhanced CVD apparatus further includes a rotating shaft 22 externally inserted into the process chamber through the bottom of the lower chamber 12. An external end of the rotating shaft 22 is connected to a rotating driving source (not shown) for being rotated. The driving source is located outside the process chamber. A susceptor 24 formed of AlN is installed inside the process chamber and connected to an internal end of the rotating shaft 22 to support a wafer 26. Further, The susceptor 24 has a heater (not shown) embedded therein to heat the wafer 26 placed thereon to a predetermined temperature and to control an internal temperature of the process chamber.

Further, a pumping pipe 32 is connected to the bottom of the lower chamber 12 to control an internal pressure of the process chamber and a vacuum pump 30 is connected to the pumping pipe 32.

As shown in FIG. 1, the conventional plasma enhanced CVD apparatus further includes a rotating shaft 22 externally inserted into the process chamber through the bottom of the lower chamber 12. An external end of the rotating shaft 22 is connected to a rotating driving source (not shown) for being rotated. The driving source is located outside the process chamber. A susceptor 24 formed of AlN is installed inside the process chamber and connected to an internal end of the rotating shaft 22 to support a wafer 26. Further, the susceptor 24 has a heater (not shown) embedded therein to heat the wafer 26 placed thereon to a predetermined temperature and to control an internal temperature of the process chamber.

FIG. 3 illustrates a block diagram to explain operation of the conventional plasma enhanced CVD apparatus and a method of forming a nitride layer using the same.

First, a protective film such as an oxide layer having a dielectric constant of about 3.8–3.9 or a nitride layer having a dielectric constant of about 7.5 is coated on inner walls of the process chamber during a step S2. Ions in plasma tend to move toward the inner walls of the process chamber due to capacitance of the process chamber walls, so that an initial nitride layer formed at the beginning of a deposition process has low uniformity in thickness. The protective film on the inner walls of the process chamber serves to prevent the initial nitride layer from having a low uniformity in thickness.

The protective film formed of the oxide layer may be formed by supplying a process gas such as nitrogen oxide $N_2O$ or nitrogen monoxide NO and a carrier gas of nitrogen $N_2$ to the process chamber and creating a plasma atmosphere in the process chamber.

The protective film formed of the nitride layer may be formed by supplying process gases of silane and ammonia to the process chamber and then adjusting the internal temperature and pressure of the process chamber, and applying a high frequency power to the process chamber to create a plasma atmosphere therein.

Next, during a step S4, a sheet of wafers is loaded onto the susceptor 24 in the process chamber by a moving means such as a robot arm.

The process chamber maintains an internal pressure of about 0.5–0.7 mTorr after activation of the vacuum pump 30, and an internal temperature of about 400° C. after activation of the heater embedded under the susceptor 24. The heater also causes the temperature of the wafer 26 on the susceptor 24 to become about 400° C.

Next, the susceptor 24 is rotated at a predetermined speed by the rotating shaft 22.

Next, during a step S6, ammonia and silane as process gases are supplied to the process chamber through the process gas supply pipe 18 and the gas distributing plate 16, and electric power of about 500–1000 W is applied to the upper chamber 10 and the lower chamber 12.

During the step S6, the process gases are converted to plasma due to an electric field induced by the electric power applied to the upper chamber 10 and the lower chamber 12, so that a plasma atmosphere is created in the process chamber.

Next, during a step S8, ions in the plasma atmosphere are deposited on the wafer 26, thereby forming a nitride layer on the wafer 26 after a predetermined time delay.

Next, during a step S10, the process gas supply and the electric power supply to the process chamber stop.

Next, during a step S12, the wafer 26 is unloaded from the susceptor 24 and shifted to the loadlock chamber 28 by the moving means of the robot arm.

Next, during a step S14, particles and process gases remaining in the process chamber are forced to be discharged by initiating a vacuum pump 30 and the inner part of the process chamber is cleaned by a cleaning gas of Argon.

Next, the steps S2–S14 are repeated about 25 times, thereby forming a nitride layer on each of 25 wafers on a sheet.

Finally, after the 25 wafers are coated with the nitride layer, the inner part of the process chamber undergoes a plasma etching cleaning process in a step S16, so that the protective film coated on the inner walls and components in the process chamber, as well as byproducts, are removed. As a result, the process chamber is completely cleaned. The plasma etching cleaning process of the step 16 is performed by supplying a gas of nitrogen trifluoride $NF_3$ and a carrier gas of Ar to the process chamber and converting the same into plasma.

The conventional plasma enhanced CVD apparatus shown in FIG. 1 has some drawbacks.

Finally, after the 25 wafers are coated with the nitride layer, the inner part of the process chamber undergoes a plasma etching cleaning process in a step S16, so that the protective film coated on the inner walls and components in the process chamber, as well as byproducts, are removed. As a result, the process chamber is completely cleaned. The plasma etching cleaning process of the step S16 is performed by supplying a gas of nitrogen trifluoride $NF_3$ and a carrier gas of Ar to the process chamber and converting the same into plasma.

Also, there is a space in the process chamber between the inner wall of the chamber and the susceptor, where the plasma may also spread, thereby further decreasing the plasma intensity.

Second, a nitride layer formed using the conventional plasma enhanced CVD apparatus has poor quality and characteristics. In the conventional plasma enhanced CVD apparatus, the gas distributing plate ejects the process gases directly downward toward the bottom of the chamber. Since the gases cannot be completely converted into plasma, the gases are deposited on the wafer. Accordingly, non-reactive particles may be deposited on the wafer, thereby lowering the quality of the nitride layer.

Further, the protective films formed on the inner walls of the process chamber have a high dielectric constant (for example, about 3.8–3.9 in case of an oxide layer, about 7.5 in case of a nitride layer), so that capacitance of the inner walls of the process chamber is still high. Therefore, ions in plasma are insufficiently deposited on the wafer, thereby forming a nitride layer with poor uniformity in thickness because ions in plasma move toward the inner walls due to the capacitance thereof.

Still further, the process gases of silane and ammonia are simultaneously supplied to the process chamber. However, the silane gas is occasionally transformed into plasma earlier than the ammonia gas. The advanced reaction causes formation of particles containing polysilicon. These particles are deposited on the wafer, resulting in deterioration of the quality and characteristics of the nitride layer.

Still further, in accordance with the conventional plasma enhanced CVD method, the nitride layer formed at a relatively low temperature of 400° C. is easily lifted by high thermal stress caused by subsequent heat treatments. The nitride layer in accordance with the conventional method is further limited by having a high degree of hydrogen content, low film density and weak oxidation resistance.

SUMMARY OF THE INVENTION

It is therefore a feature of an embodiment of the present invention to provide a plasma enhanced CVD apparatus capable of forming a nitride layer of high quality by preventing a decrease in plasma intensity during a deposition process and a method of forming a nitride layer using the same.

It is therefore another feature of an embodiment of the present invention to provide a plasma enhanced CVD apparatus capable of preventing non-reactive particles from being formed and deposited on a wafer by completely converting reactive gases to plasma and a method of forming a nitride layer using the same.

It is therefore another feature of an embodiment of the present invention to provide a plasma enhanced CVD apparatus capable of reducing capacitance of inner walls of a process chamber, thereby forming a nitride layer of high quality and a method of forming a nitride layer using the same.

It is therefore still another feature of an embodiment of the present invention to provide a plasma enhanced CVD apparatus capable of forming a nitride layer with a low degree of hydrogen content, high density and strong oxidation resistance, and a method of forming a nitride layer using the same.

According to one aspect of the preset invention, a preferred embodiment of the present invention provides a plasma enhanced CVD apparatus. The apparatus includes a process chamber including an upper chamber with a dome shape, a lower chamber, and an insulator placed between the upper chamber and the lower chamber, a gas distributing ring installed in the process chamber for ejecting a gas in an upward direction inside the process chamber, a susceptor installed below the gas distributing ring for supporting a wafer thereon, and having a heater for controlling a temperature of the wafer and an internal temperature of the process chamber, a plasma compensation ring installed at an upper part of side walls of the susceptor, a vacuum pump connected to the process chamber, and an electric power source connected to the upper chamber and the lower chamber.

Preferably, the gas distributing ring has a plurality of nozzles at inner walls thereof, wherein each of the plurality of nozzles is upwardly sloped with an inclination of, for example, 30–60 degrees, thereby allowing upward distribution of a gas. The gas distributing ring and/or the plasma compensation ring may be made of stainless steel.

The plasma enhanced CVD apparatus may further include a loadlock chamber connected to the process chamber.

The susceptor is preferably coated with $Al_2O_3$, so that the susceptor is not etched by nitrogen trifluoride plasma during a plasma etching cleaning process.

According to another aspect of the preset invention, a preferred embodiment of the present invention provides a method of forming a nitride layer using a plasma enhanced CVD apparatus. The method includes loading a wafer onto a susceptor, supplying a first reactive gas containing nitrogen $N_2$ to a process chamber, leaving the wafer intact for a first delay time, forming a basic layer on the wafer by converting the first reactive gas into plasma which is created by applying electric power to the process chamber, leaving the wafer intact for a second delay time, forming a nitride layer on the wafer having the basic layer thereon by supplying a second reactive gas to the process chamber and converting the second reactive gas into plasma, leaving the wafer intact for a third delay time, stopping the supply of the first and second reactive gases to the process chamber, leaving the wafer intact for a fourth delay time, stopping applying the electric power, and unloading the wafer from the susceptor.

The wafer may be loaded and unloaded through a loadlock chamber connected to the process chamber so that the wafer is not exposed to air, thereby preventing oxidation of the wafer.

Ammonia and silane may be used as the first reactive gas and the second reactive gas, respectively.

Forming the nitride layer is preferably performed in the process chamber having an internal temperature of 580–670° C., an internal pressure of 0.5–0.7 mTorr, and an electric power applied thereto of 100–700 W.

A protective film may be formed on inner walls of the process chamber before loading the wafer, the protective film preferably being formed of at least two layers (i.e. an oxide layer and a nitride layer), each of which has a dielectric constant different from the others. For example, an oxide layer may be formed on the inner walls of the process chamber, and a nitride layer may be formed on the oxide layer.

The oxide layer as the protective film may be formed by supplying nitrogen oxygen gas $N_2O$ or NO to the process chamber and converting the same into plasma. The nitride layer as the protective film may formed by introducing ammonia gas and silane gas into the process chamber and converting the same gases into plasma.

After unloading the wafer, the process chamber may be vacuumed to compulsorily exhaust a gas remaining in the process chamber and a cleaning gas may be supplied to the process chamber.

After unloading the wafer, plasma etching cleaning to clean inner walls of the process chamber and components installed in the process chamber may be performed. The plasma etching cleaning is preferably performed by supplying nitrogen trifluoride gas to the process chamber and converting the same gas into plasma.

These and other aspects, features, and advantages of the present invention will become more apparent from the following detailed description of preferred embodiments, which is to be read in conjunction with the accompanying drawings.

DETAILED DESCRIPTION OF THE INVENTION

Korean Patent Application No. 2001-66104, filed on Oct. 25, 2001, and entitled: "Plasma Enhanced Chemical Vapor Deposition Apparatus And Method For Forming Nitride Layer Using The Same," is incorporated by reference herein in its entirety.

Figure 1:
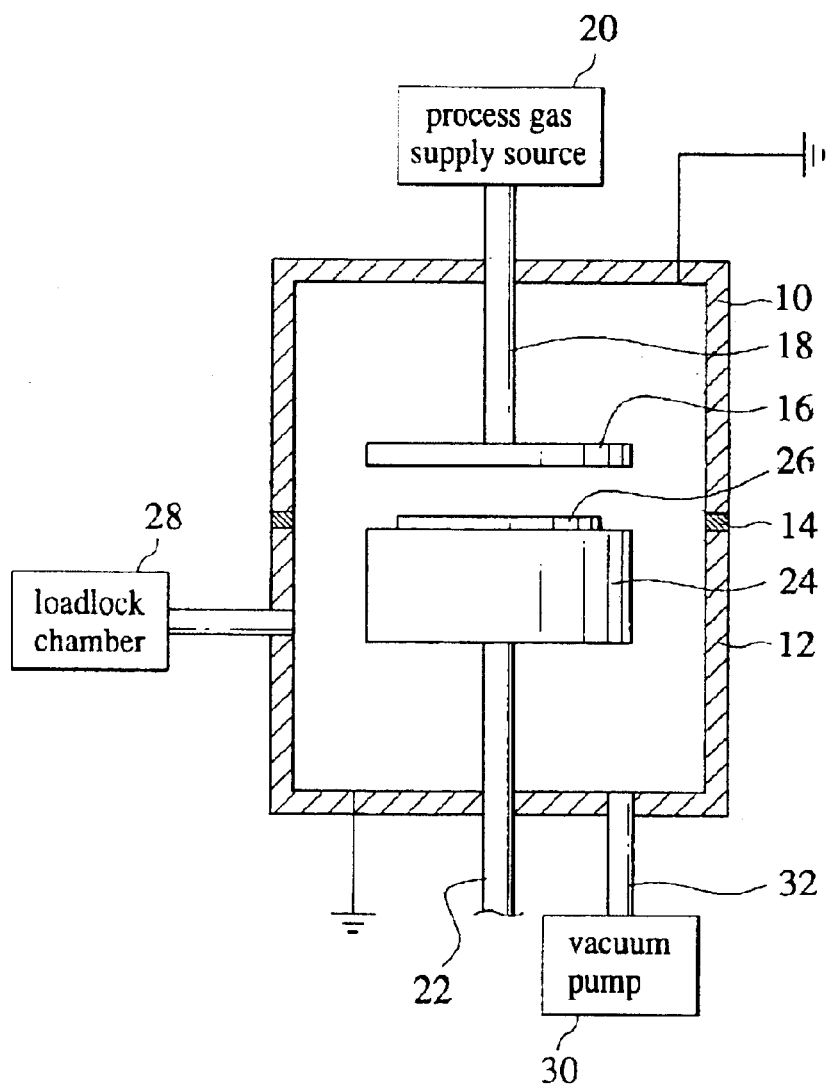
FIG. 1 illustrates a schematic view of a conventional plasma enhanced CVD apparatus.
Figure 2:
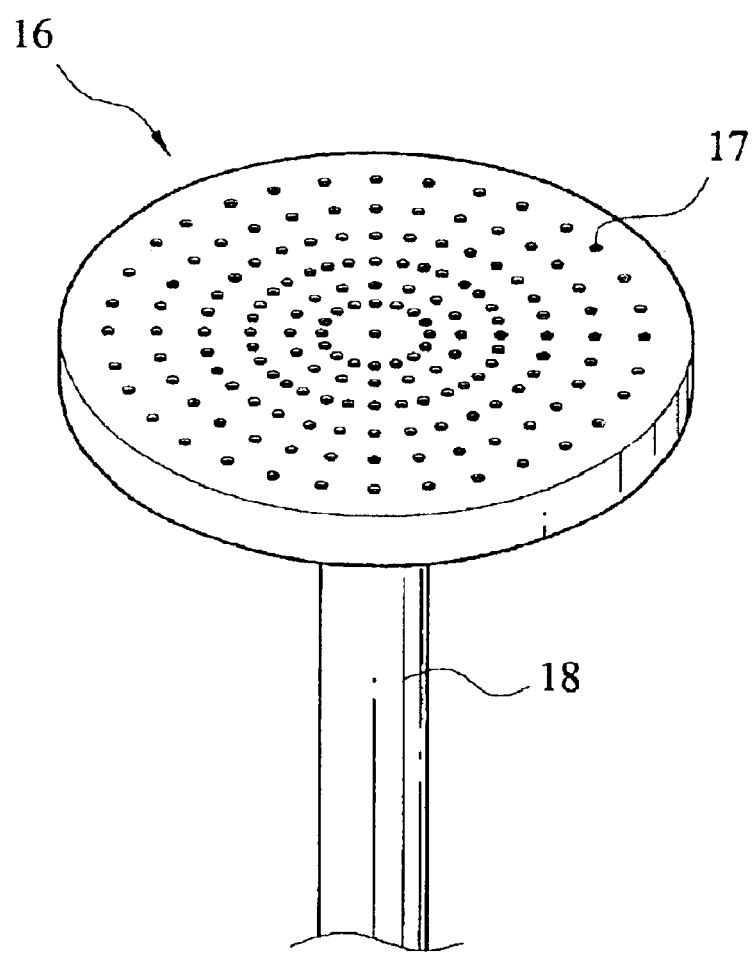
FIG. 2 illustrates a perspective view of a gas distributor in accordance with the conventional plasma enhanced CVD apparatus.
Figure 3:
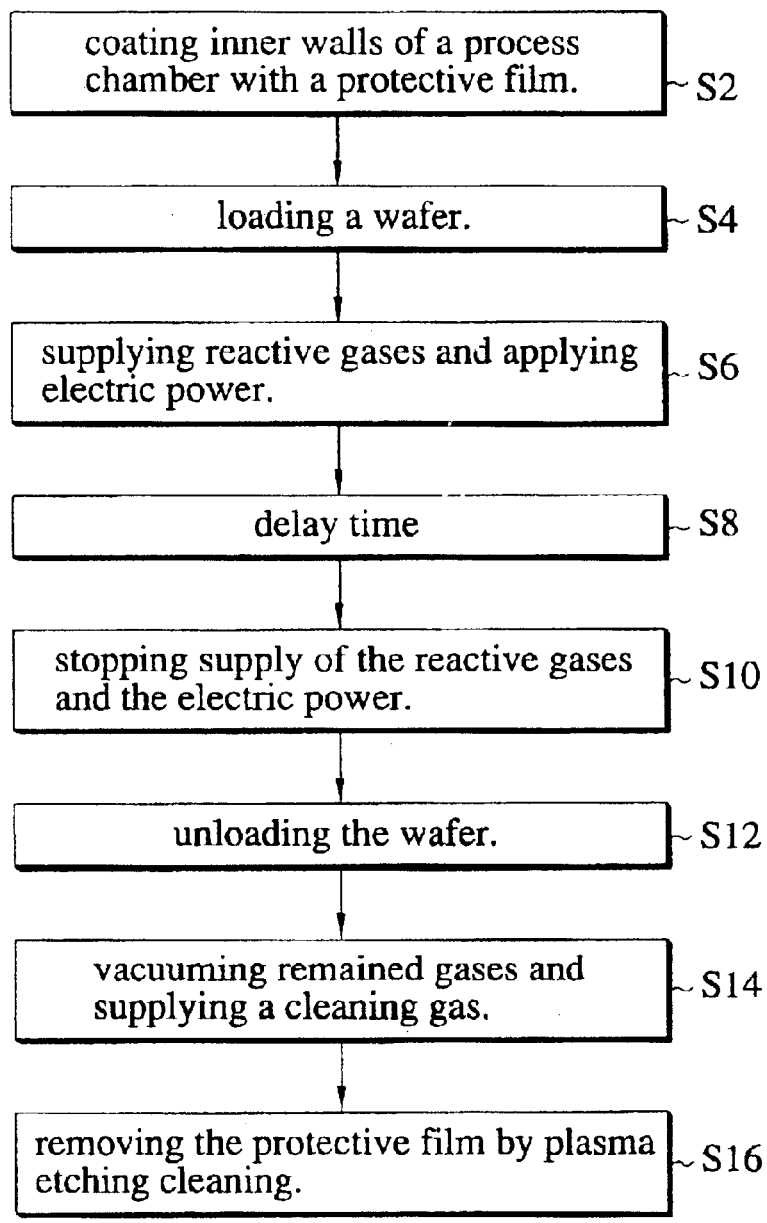
FIG. 3 depicts a block diagram illustrating a method of forming a nitride layer using a conventional plasma enhanced CVD apparatus.
Figure 4:
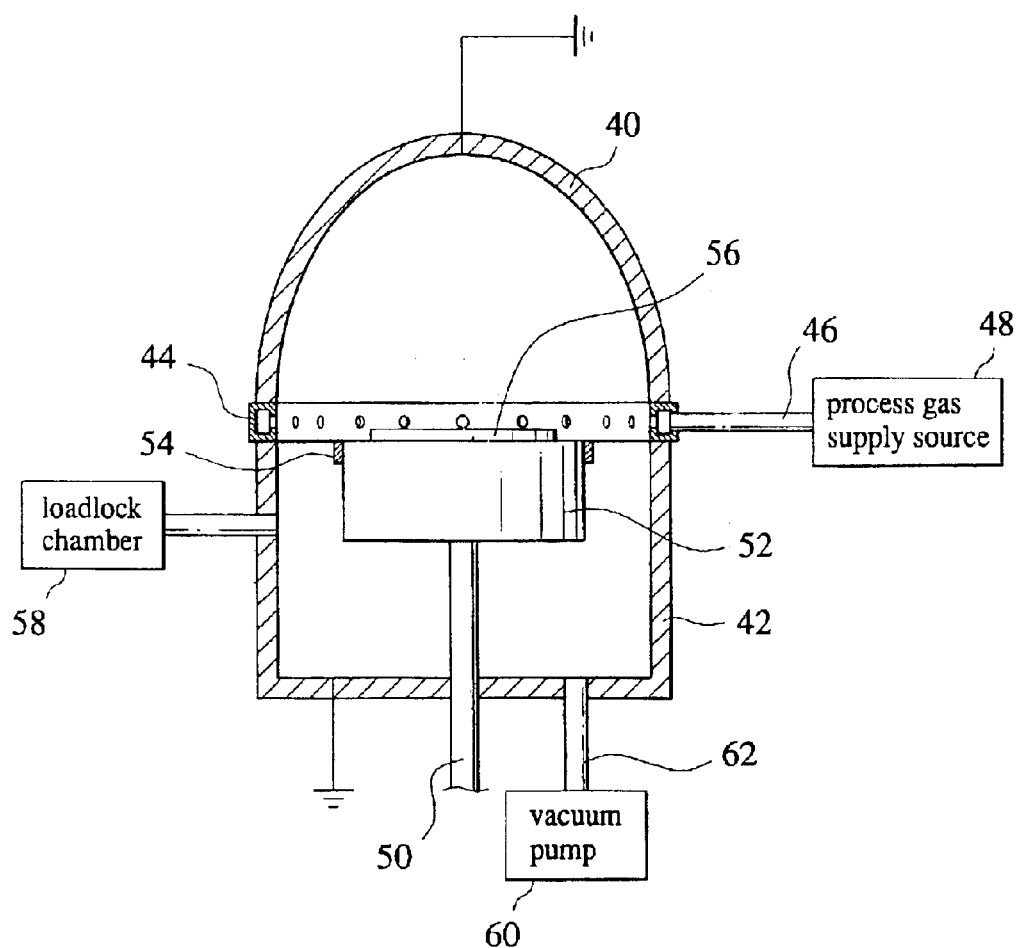
FIG. 4 illustrates a schematic view of a plasma enhanced CVD apparatus in accordance with the present invention.

FIG. 4 illustrates a schematic view of a plasma enhanced CVD apparatus in accordance with the present invention. As shown in FIG. 4, the apparatus includes a process chamber in which a nitride layer would be formed, a gas supply pipe 46, a susceptor 52, a plasma compensation ring 54, a vacuum pump 60, and electric power source.

The process chamber comprises an upper chamber 40 with a dome shape, a cylinder-type lower chamber 42, and a gas distributing ring 44 made of stainless steel. The gas distributing ring 44 is placed between the upper chamber 40 and the lower chamber 42.

The upper chamber 40 and the lower chamber 42 serve as an upper electrode and a lower electrode, respectively, thereby forming an electric field in the process chamber by applying electric power thereto.

It is noted that the upper chamber 40 has a dome shape, so that plasma intensity does not decrease due to the spreading of the plasma throughout the cylindrical-type upper chamber as in the prior art.

Insulation between the upper chamber 40 and the lower chamber 42 may be achieved by placing insulating materials or components therebetween, instead of the gas distributing ring 44. The gas distributing ring 44 may be employed inside the process chamber by being supported with a fixing means.

A process gas supply source 48 is connected to one end of the gas supply pipe 46 external to the process chamber. The other end of the gas supply pipe 46 is connected to the gas distributing ring 44 to allow process gas to be supplied to the gas distributing ring 44.

Figure 5:
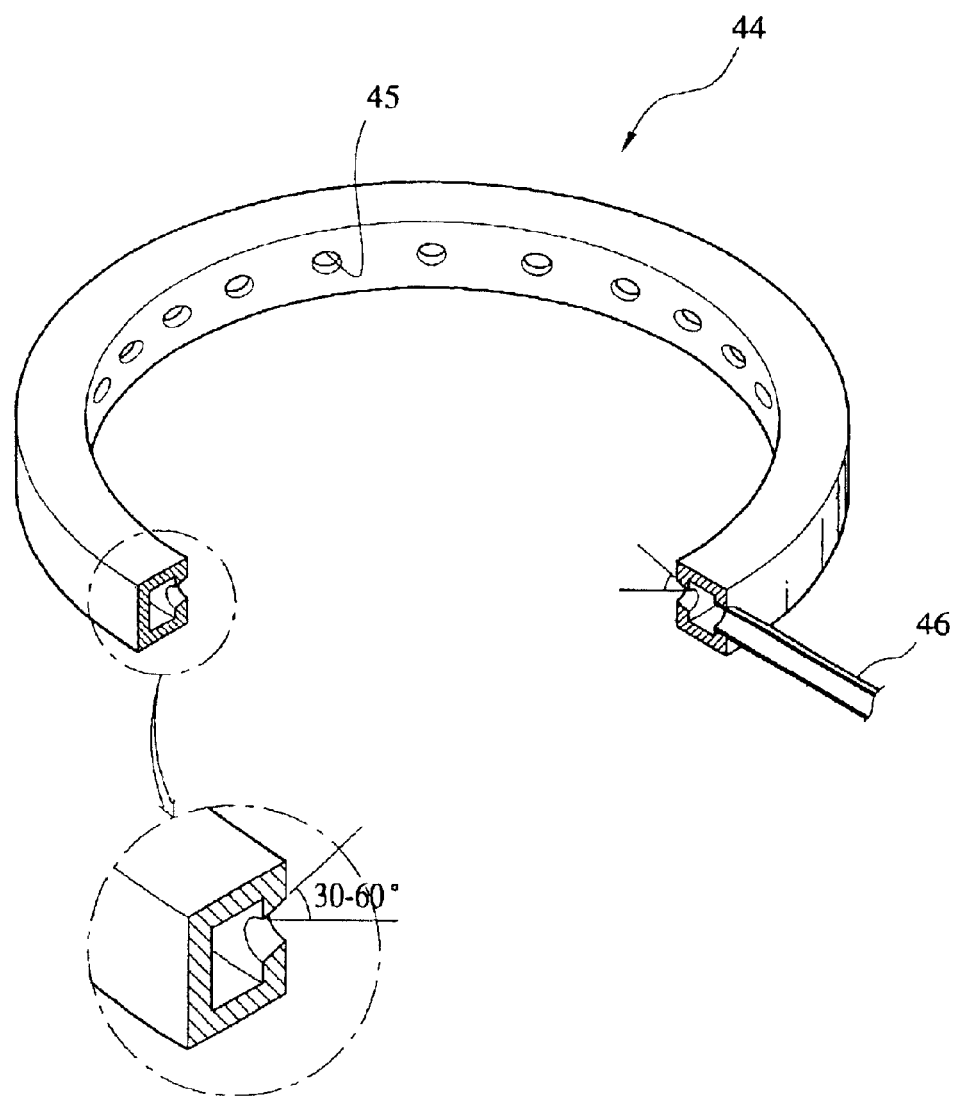
FIG. 5 illustrates a partial perspective view of a gas distributing ring in accordance with the present invention.

FIG. 4 shows that a diameter of the gas distributing ring 44 is the same as the diameter of the cylindrical-type lower chamber 42 and a bottom of the dome-shaped upper chamber 40. Therefore, the gas distributing ring 44 may be properly or precisely fixed between the upper chamber 40 and the lower chamber 42. Further, as may be seen in FIG. 5, the gas distributing ring 44 has a plurality of nozzles 45 at an inner sidewall thereof. Each of the plurality of nozzles 45 is upwardly inclined at an inclination angle of about 30–60 degrees, and more preferably about 45 degrees. Therefore, the reactive gas may be ejected in an upward direction from the nozzles 45 at a predetermined angle of inclination, so that a retention time of the reactive gas in the process chamber is increased. As a result, the reactive gas is almost entirely converted into plasma, thereby reducing formation of particles on the wafer.

A rotating shaft 50 is externally inserted into the lower chamber 42 through a bottom of the lower chamber 42. The rotating shaft 50 is rotated by driving gear (not shown). Further, a susceptor 52 made preferably of AlN is installed on the top of the rotating shaft 50 in the process chamber. The susceptor 52 includes an embedded heater for heating a wafer 56 placed thereon and for adjusting an internal temperature of the process chamber to about 650° C. A refractory metal layer such as aluminum oxide $Al_2O_3$ may be coated on a surface of the susceptor 52, thereby preventing the susceptor 52 from being etched by plasma created in the process chamber under a high temperature.

The plasma compensation ring 54 surrounds the susceptor 52 at an upper portion of sidewalls of the susceptor 52. The plasma compensation ring 54 reduces a distance between the susceptor 52 and the inner walls of the lower chamber 42, thereby preventing the plasma from spreading to a space between the susceptor 52 and the inner wall of the lower chamber 42.

The plasma enhanced CVD apparatus in accordance with the present invention may further include a loadlock chamber 58 at one side of the lower chamber 42. Wafers are placed in the loadlock chamber 58 before being loaded to the susceptor 52 or after being unloaded from the susceptor 52.

The vacuum pump 60 is connected to the lower chamber 42 for controlling internal pressure of the process chamber. The vacuum pump 60 is connected to the lower chamber 42 by means of a pumping pipe 62 through the bottom of the lower chamber 42.

Figure 6:
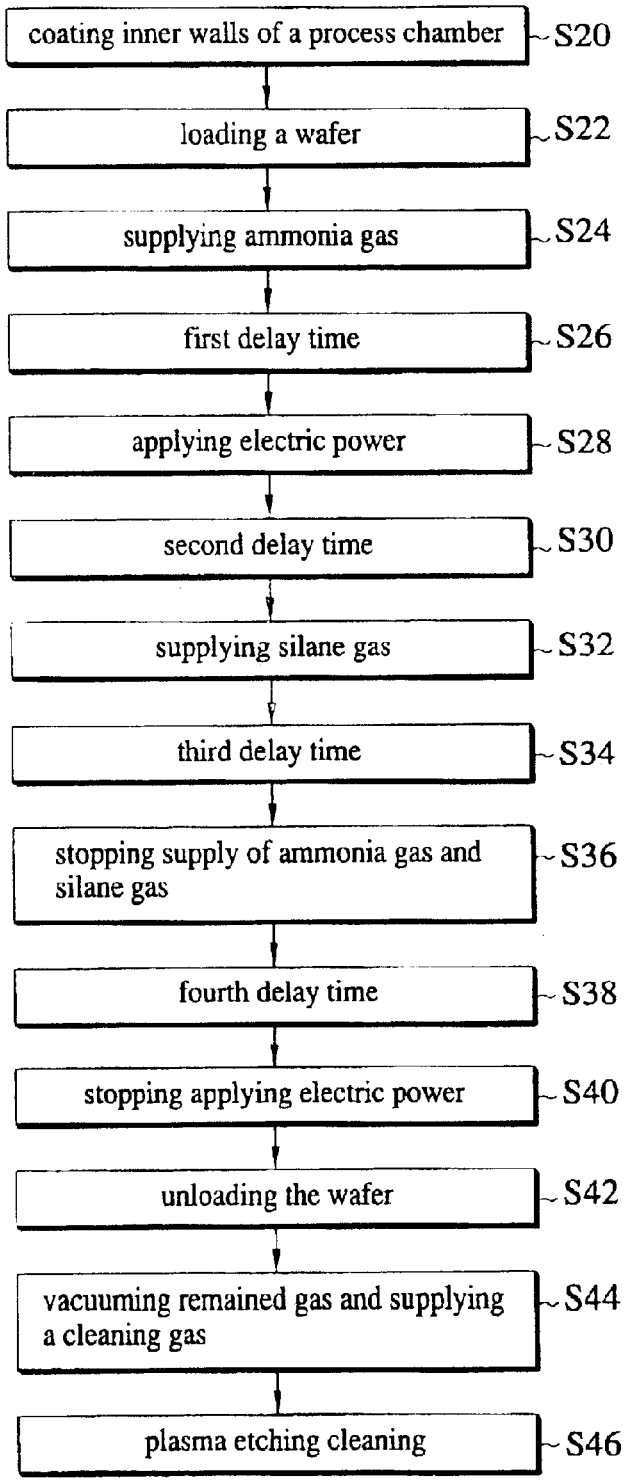
FIG. 6 depicts a block diagram illustrating a method of forming a nitride layer using a plasma enhanced CVD apparatus in accordance with the present invention.

FIG. 6 depicts a block diagram illustrating a method of forming a nitride layer using the plasma enhanced CVD apparatus in accordance with a preferred embodiment of the present invention.

First, in step S20, a protective film is formed on inner walls of the process chamber. The protective film may be formed of a double layer including a nitride layer having a dielectric constant A, about 3.8–3.9, and an oxide layer having a dielectric constant B, about 7.5. The protective film prevents ions in plasma from moving toward the inner walls of the process chamber, thereby forming an initial nitride layer with excellent uniformity of thickness. The protective film formed in accordance with the present invention has a dielectric constant C, about 2.5, which is calculated as follows:

$$\text{Dielectric constant } C=(A\times B)/(A+B)$$

The protective film in accordance with the present invention has a dielectric constant much lower than that of the conventional protective film. Therefore, the protective film of the present invention effectively prevents the ions in plasma from moving toward the inner walls of the process chamber.

The oxide layer comprising the protective film of the present invention is formed by supplying a process chamber with a carrier gas of nitrogen $N_2$ and a reactive gas of nitrogen oxygen gas $N_2O$ or NO, and then adjusting factors to create a plasma atmosphere. The factors include internal pressure and internal temperature of the process chamber and electric power.

The nitride layer comprising the protective film of the present invention is formed by supplying a process chamber with nitrogen $N_2$ as a carrier gas and silane and ammonia as reactive gases, and then creating a plasma atmosphere in the process chamber. The plasma atmosphere is created by adjusting various factors such as internal pressure and temperature of the process chamber and electric power.

Next, in step S22, a wafer 56 is loaded on the susceptor 52 by a moving means such as a robot arm. The wafer 56 is sustained on the loadlock chamber 58 having a pressure of 200 mTorr before being loaded onto the susceptor 52. Although the wafer 56 is coated with an easily oxidizable layer such as tungsten, the wafer 56 is free from being oxidized because it is not exposed to air.

During the step 22, as the vacuum pump 60 is initiated, the process chamber having a susceptor 52 on which the wafer 56 is loaded is vacuumed, thereby maintaining an internal pressure of about 0.5–0.7 mTorr. Further, heating the susceptor 52 by a heater raises the temperature of the wafer 56 and the internal temperature of the process chamber to about 580–670° C., respectively. During the step S22, the susceptor 52 connected to the rotating shaft 50 is being rotated.

Next, in step 24, ammonia as a reactive gas is supplied to the process chamber from the gas supply source 48 through the gas supply pipe 46 and the gas distributing ring 44 at 200 SCCM (standard cubic centimeter minute).

Next, in step S26, there is a first delay time of about 10 seconds. The wafer 26 is left intact in the process chamber for the first delay time.

Next, in step S28, an electric power of 100–700 W is applied to the upper chamber 40 and the lower chamber 42 serving as the upper electrode and the lower electrode, respectively, so that the ammonia is converted into plasma. During the step S28, the ammonia is upwardly ejected at an inclination angle of about 45 degrees toward the center of the process chamber through the nozzles 45 of the gas distributing ring 44. Therefore, enough time is allowed for the ammonia gas to be converted into plasma. At this time, nitrogen contained in the ammonia gas is deposited on the wafer 56, thereby forming a basic layer of nitrogen. The basic layer serves as a seed to form a nitride layer. A nitride layer to be formed on the basic layer has high quality in aspects of the thickness uniformity, reflectance index and absorption index. Further, ion bombardment to the wafer is avoided due to the low electric power of about 100 W–700 W applied while creating a plasma atmosphere in the process chamber. The upper chamber 40 has a dome shape and the susceptor 52 has a plasma compensation ring 54, thereby increasing plasma intensity of ammonia in the process chamber.

Next, in step S30, there is a second delay time of about 10 seconds. The wafer is left intact in the process chamber for the second delay time.

Next, in step S32, the silane gas is supplied to the process chamber at 70–100 SCCM through the gas distributing ring 44 and the gas supply pipe 46 from the gas supply source 48.

During the step S32, the silane gas is converted into plasma and reacted with the ammonia plasma created in advance, thereby forming a nitride layer $Si_3N_4$ and forming $H_2$ gas as a byproduct. Thus, the hydrogen gas should be discharged out of the process chamber.

In the step S32, the process chamber maintains a high internal temperature of 580–670° C., so that the nitride layer formed in step S32 has many advantages. That is, the nitride layer formed at the high temperature is hardly lifted and has properties of low hydrogen content, high density and strong oxidation resistance.

In the step S32, the silane gas is ejected upward with an inclination of 45 degrees toward the center of the process chamber through the gas distributing ring 44. Thus, retention time is long enough for the ammonia gas to completely react with the silane gas, thereby preventing particles containing polysilicon from being formed and deposited on the wafer.

Further, the upper chamber 40 is formed to have a dome shape and the plasma compensation ring 54 is installed to surround the susceptor 52 at upper portions of sides thereof. Therefore, the plasma intensity of the silane is not decreased, and a nitride layer having good uniformity of thickness may be formed.

Next, in step S34, there is a third delay time of about 10 seconds after step S32. The wafer is left intact in the process chamber during the third delay time.

Next, in step S36, supply of the reactive gases of ammonia and silane stops.

Next, in step S38, there is a forth delay time of about 10 seconds. The wafer is left intact in the process chamber during the fourth delay time. During the step S38, the ammonia gas plasma and the silane gas plasma remaining in the process chamber are completely reacted with each other, thereby preventing reactive particles from being deposited onto the wafer.

Next, in step S40, power supply to the upper chamber 40 and the lower chamber 42 stops.

Next, in step S42, the wafer 56 having the nitride layer thereon is unloaded from the susceptor 52 and transferred to the loadlock chamber 58.

Next, in step S44, the process chamber is vacuumed by means of the vacuum pump 60, and nitrogen gases are supplied to the process chamber, so that the byproducts and non-reactive gases remaining in the process chamber are completely removed, thereby cleaning the process chamber.

The steps S20–S44 are repeatedly performed, up to about 25 times, so that 25 wafers may be deposited with the nitride layers.

Finally, in step S46, a plasma etching cleaning process is performed to completely clean the process chamber. That is, a mixed gas of nitrogen trifluoride $NF_3$ as a reactive gas and Argon as a carrier gas is supplied to the process chamber and the mixed gas is transformed into plasma. During the step S46, the protective film deposited on the inner walls of the process chamber and other components in the process chamber is etched away by the plasma of the mixed gas, thereby completely cleaning the process chamber.

During the step S46, a temperature of about 650° C. is maintained, so that particles may be generated because the susceptor 52 made of AlN can be etched at that temperature. However, in accordance with an embodiment of the present invention, the susceptor 52 is coated with aluminum oxide $Al_2O_3$, thereby preventing particles from being formed during the plasma etching cleaning process.

Now, advantages of the present invention will be described below based on various experiments.

First Experiment

A first experiment was performed as follows, and the results are listed in table 1. Nitride layers were formed while varying an internal temperature of the process chamber, i.e., 400° C., 450° C., 550° C., 600° C. and 650° C., while other conditions remained fixed. That is, the other conditions such as process gas, protective film and internal pressure of the process chamber were the same as those in the steps S20–S46 described above. In table 1, the nitride layers formed at temperatures of 600° C. and 650° C. are referred to as a first embodiment and a second embodiment, respectively. The nitride layers formed at temperatures of 400° C., 450° C., and 550° C. are referred to as a first comparative example, a second comparative example and a third comparative example, respectively.

Each of the nitride layers was formed to have reflection index R & I out of 1.9, 1.94, 1.98, 2.03 or 2.1 against a light source having a wavelength of 673 nm.

A frequency of occurrences of a popping phenomenon, i.e., the nitride layer being protruded, lifted or popped, was measured. The results of the popping frequency are indicated in Table 1.

TABLE 1

| Temp. | R&I | | | | | |
|---|---|---|---|---|---|---|
| | 1.86 | 1.9 | 1.94 | 1.98 | 2.03 | 2.1 |
| 400° C. (1st comparative example) | — | — | — | 100 | — | — |
| 450° C. (2nd comparative example) | — | 16 | — | — | — | — |
| 550° C. (3rd comparative example) | — | — | — | — | 10 | — |
| 600° C. (1st embodiment) | 2 | 3 | 0 | 0 | 0 | 0 |
| 650° C. (2nd embodiment) | 0 | 0 | 0 | 0 | 0 | 0 |

As shown in table 1, the first comparative example indicates that 100 nitride layers having R&I 1.98 were popped. The second comparative example indicates that 16 nitride layers having R&I 1.9 were popped. The third comparative example indicates that 10 nitride layers having R&I 1.98 were popped.

However, the first embodiment of the present invention indicates that only 5 nitride layers were popped, and the second embodiment of the present invention indicates no popped nitride layers at al.

Second Experiment

Next, a second experiment was performed, and the results are listed in table 2. The nitride layers were formed under the same conditions as in the first experiment, and a hydrogen content of each nitride layer was measured.

In table 2, the nitride layers formed at temperatures of 600° C. and 650° C. are referred to as a third embodiment and a fourth embodiment, respectively. The nitride layers formed at temperatures of 400° C., 450° C., and 550° C. are referred to as a fourth comparative example, a fifth comparative example and a sixth comparative example, respectively.

TABLE 2

| Temp. | R&I | | | | | |
|---|---|---|---|---|---|---|
| | 1.86 | 1.9 | 1.94 | 1.98 | 2.03 | 2.1 |
| 400° C. (4th comparative example) | — | — | — | 10.5 | — | — |
| 450° C. (5th comparative example) | — | 11.6 | — | — | — | — |
| 550° C. (6th comparative example) | — | — | — | — | 7.5 | — |
| 600° C. | 7.0 | 6.9 | 6.8 | — | 5.8 | 5.4 |

TABLE 2-continued

| Temp. | | R&I | | | | |
|---|---|---|---|---|---|---|
| | 1.86 | 1.9 | 1.94 | 1.98 | 2.03 | 2.1 |
| (3rd embodiment) 650° C. (4th embodiment) | 0 | 5.5 | 5.3 | 4.8 | 3.8 | 4.0 |

The fourth comparative example indicates a hydrogen content of 10.5 atoms/cm$^3$. Further, 11.6 atoms/cm$^3$ and 7.5 atoms/cm$^3$ of hydrogen content were detected in the fifth and the sixth comparative examples, respectively.

In the nitride layers formed in accordance with the third embodiment of the present invention, 7.0 atoms/cm$^3$, 6.9 atoms/cm$^3$, 6.8 atoms/cm$^3$, 5.8 atoms/cm$^3$ and 5.4 atoms/cm$^3$ of hydrogen content were detected. Further, 5.5 atoms/cm$^3$, 5.3 atoms/cm$^3$, 4.8 atoms/cm$^3$, 3.8 atoms/cm$^3$ and 4.0 atoms/cm$^3$ of hydrogen content were detected in the nitride layers formed in accordance with the fourth embodiment of the present invention.

Therefore, table 2 confirms that the nitride layers formed in accordance with preferred embodiments of the present invention contain relatively low hydrogen content in comparison with the third to sixth comparative examples.

Third Experiment

The third experiment relates to the uniformity of thickness of the nitride layers. Nitride layers formed in accordance with seventh and eighth comparative examples are formed under nearly the same conditions as the preferred embodiments of the present invention, i.e., the steps S20–S46, except for a condition of the protective film formed on inner walls of the process chamber. The nitride layer formed in accordance with the seventh comparative example is formed using a process chamber having a protective film of nitride. The nitride layer in accordance with the eighth comparative example is formed using a process chamber having a protective film of oxide. The nitride layer formed in accordance with a fifth embodiment of the present invention is formed using a process chamber having a protective film formed of a double layer of an oxide layer and a nitride layer.

Figure 7:
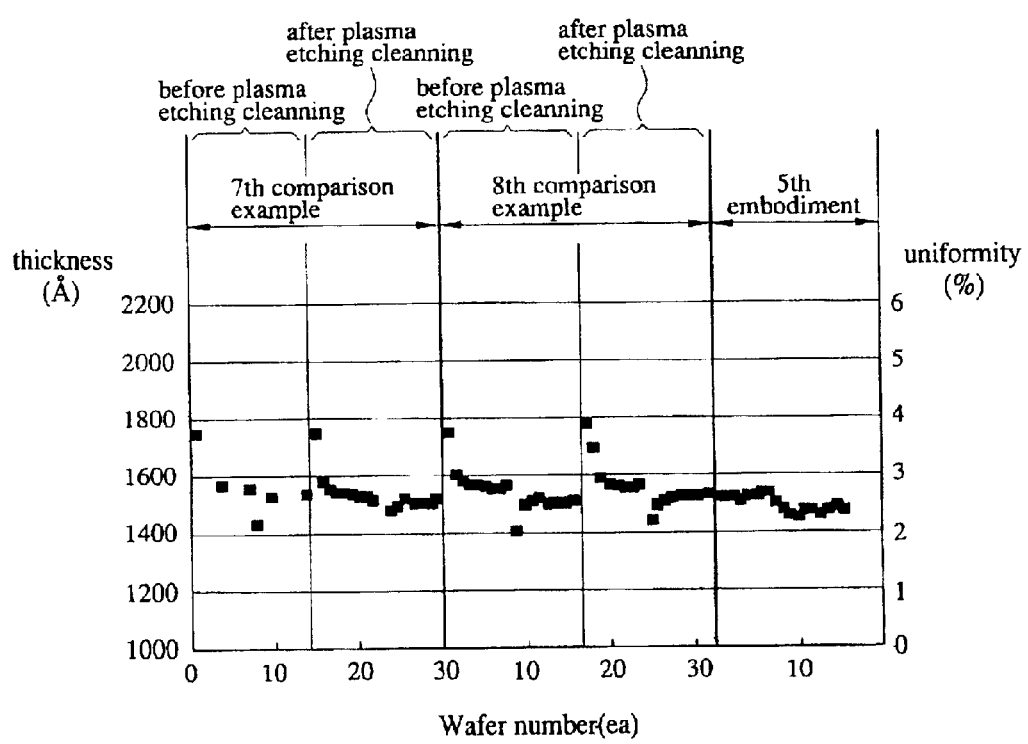
FIG. 7 depicts a graph illustrating thickness uniformity of a nitride layer which is formed in a process chamber having a protective film formed of one among nitride, oxide and oxide/nitride on inner walls thereof.

FIG. 7 shows the thickness and uniformity of the nitride layers formed in accordance with the seventh comparative example, the eighth comparative example and the fifth embodiment. As shown in FIG. 7, a first nitride layer formed in both the seventh and eighth comparative example is much thicker than subsequently formed nitride layers. However, thickness of a first nitride layer formed in accordance with the fifth embodiment is practically the same as the thickness of nitride layers subsequently formed in accordance with the fifth embodiment. Therefore, the third experiment confirms that the present invention provides a nitride layer having good uniformity of thickness.

Fourth Experiment

The fourth experiment relates to a characteristic of thermal stress. Nitride layers were formed while varying a temperature of the process chamber, while other conditions remained the same as those in the steps S20–S46. The nitride layers formed at each temperature of 400° C., 550° C., 600° C., and 650° C. are referred to as a ninth comparative example, a tenth comparative example, a sixth embodiment and a seventh embodiment, respectively. In the fourth experiment, after formation of the nitride layers, the nitride layers undergo heat treatments with great temperature variations from 0° C. to 900° C. and thermal stress is observed.

Figure 8:
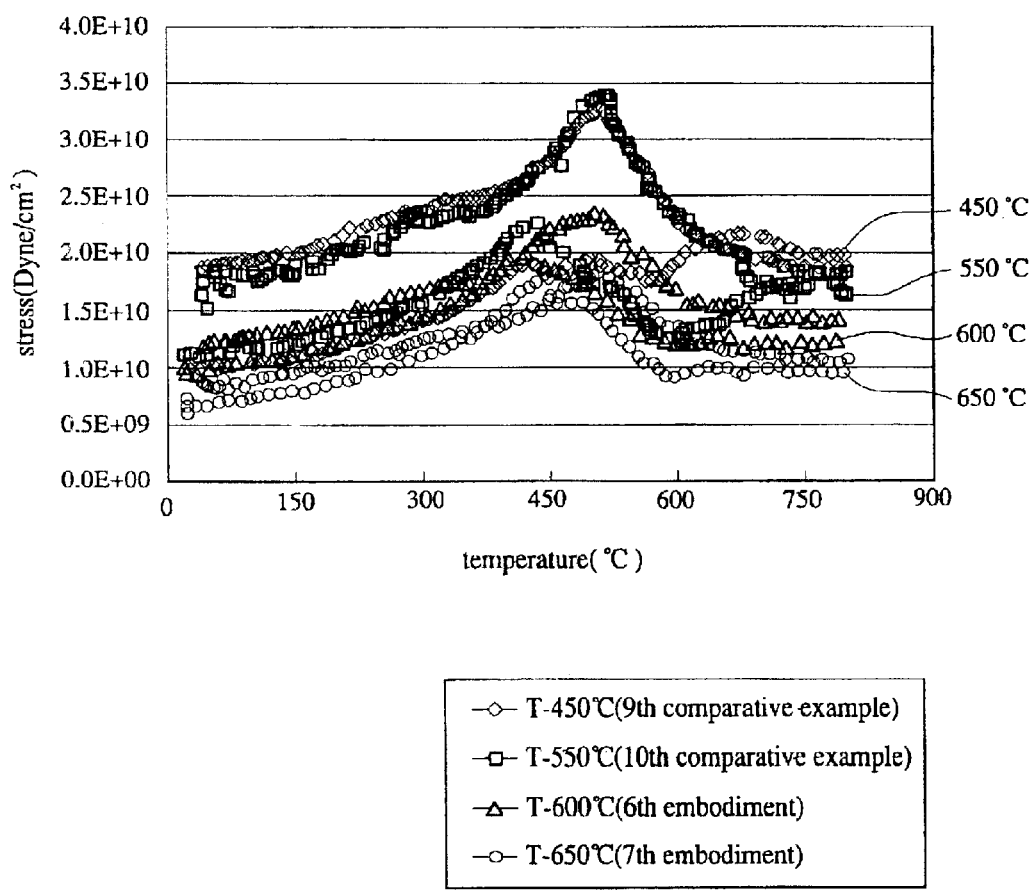
FIG. 8 depicts a graph illustrating intensity of thermal stress of nitride layers formed by varying internal temperature of the process chamber.

FIG. 8 shows the results of the fourth experiment. The nitride layers formed in accordance with the ninth and tenth comparative examples show relatively great fluctuation ranges in thermal stress compared with that of the nitride layers formed in accordance with the sixth and the seventh embodiments of the present invention. Accordingly, it is noted that the nitride layers formed in accordance with the embodiments of the present invention are thermally stable with narrow fluctuation range of the thermal stress.

Preferred embodiments of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma enhanced CVD apparatus, comprising:
    a process chamber including an upper chamber with a dome shape, a lower chamber, and an insulator placed between the upper chamber and the lower chamber;
    a gas distributing ring installed in the process chamber for ejecting a gas in an upward direction inside the process chamber;
    a susceptor installed below the gas distributing ring for supporting a wafer thereon, and having a heater for controlling a temperature of the wafer and an internal temperature of the process chamber;
    a plasma compensation ring installed at an upper part of sidewalls of the susceptor;
    a vacuum pump connected to the process chamber; and
    an electric power source connected to the upper chamber and the lower chamber.

2. The apparatus as claimed in claim 1, wherein the gas distributing ring has a plurality of nozzles at inner walls thereof, wherein each of the plurality of nozzles is upwardly sloped with an inclination of a predetermined degree.

3. The apparatus as claimed in claim 2, wherein the degree of inclination is in a range of from 30° C. to 60° C.

4. The apparatus as claimed in claim 1, wherein the gas distributing ring is made of stainless steel.

5. The apparatus as claimed in claim 1, further comprising a loadlock chamber connected to the process chamber.

6. The apparatus as claimed in claim 1, wherein the susceptor is coated with $Al_2O_3$.

7. The apparatus as claimed in claim 1, wherein the plasma compensation ring is formed of stainless steel.

* * * * *